United States Patent
Chandra et al.

(10) Patent No.: US 6,496,955 B1
(45) Date of Patent: Dec. 17, 2002

(54) LATCH MAPPER

(75) Inventors: Arun Chandra, Cupertino, CA (US); Daniel L. Liebholz, Cambridge, MA (US); Vivek D. Sagdeo, Cupertino, CA (US); Marcelino M. Dignum, Menlo Park, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 133 days.

(21) Appl. No.: 09/595,150

(22) Filed: Jun. 16, 2000

(51) Int. Cl.$^7$ .............................................. G06F 17/50
(52) U.S. Cl. ................... 716/3; 703/27; 716/5; 716/7; 716/18
(58) Field of Search ........................... 703/27; 716/1–21

(56) References Cited

U.S. PATENT DOCUMENTS

| | | | | |
|---|---|---|---|---|
| 5,491,639 A | * | 2/1996 | Filkorn | 716/5 |
| 5,493,508 A | * | 2/1996 | Dangelo et al. | 716/5 |
| 5,638,381 A | | 6/1997 | Cho et al. | 371/22.4 |
| 5,727,187 A | | 3/1998 | Lemche et al. | 395/500 |
| 5,841,663 A | * | 11/1998 | Sharma et al. | 716/18 |
| 5,867,395 A | | 2/1999 | Watkins et al. | 364/488 |
| 6,059,837 A | * | 5/2000 | Kukula et al. | 703/27 |
| 6,247,163 B1 | * | 6/2001 | Burch et al. | 716/3 |

OTHER PUBLICATIONS

A. Kuehlmann and F. Krohm, "Equivalence Checking Using Cuts and Heaps," Proceedings of the 34th annual conference on Design automation conference, 1997, pp. 263–268.

"CSCI 320 Computer Architecture Handbook on Verilog HDL," Daniel C. Hyde, Computer Science Department, Bucknell University, Lewisburg, Pennsylvania, Aug. 25, 1995, pp. 1–32.

J. Burch and V. Singhal, "Robust Latch Mapping for Combinational Equivalence Checking," Proceedings of the 1998 IEEE/ACM international conference on Computer–aided design, 1998, pp. 563–569.

P. Ashar et al., "Using Complete–1–Distinguishability for FSM Equivalence Checking," Proceedings of the 1996 IEEE/ACM International Conference on Computer–aided design, 1996, pp. 346–353.

* cited by examiner

*Primary Examiner*—Vuthe Siek
*Assistant Examiner*—H Rossoshek
(74) *Attorney, Agent, or Firm*—Rosenthal & Osha L.L.P.

(57) ABSTRACT

A method for constructing a latch mapping between a first level description and a second level description of a digital system, wherein the first level description and the second level descriptions identify components in the digital system using a predefined naming convention, is provided. The method includes identifying first latch components in the first level description and, for each identified first latch component, storing a first string comprising a selected property of the first latch component in a first storage. The method further includes identifying second latch components in the second level description and, for each second latch component, storing a second string comprising a selected property of the second latch component in a second storage. The method further includes generating a latch mapping by matching the first strings in the first storage with the second strings in the second storage.

25 Claims, 11 Drawing Sheets

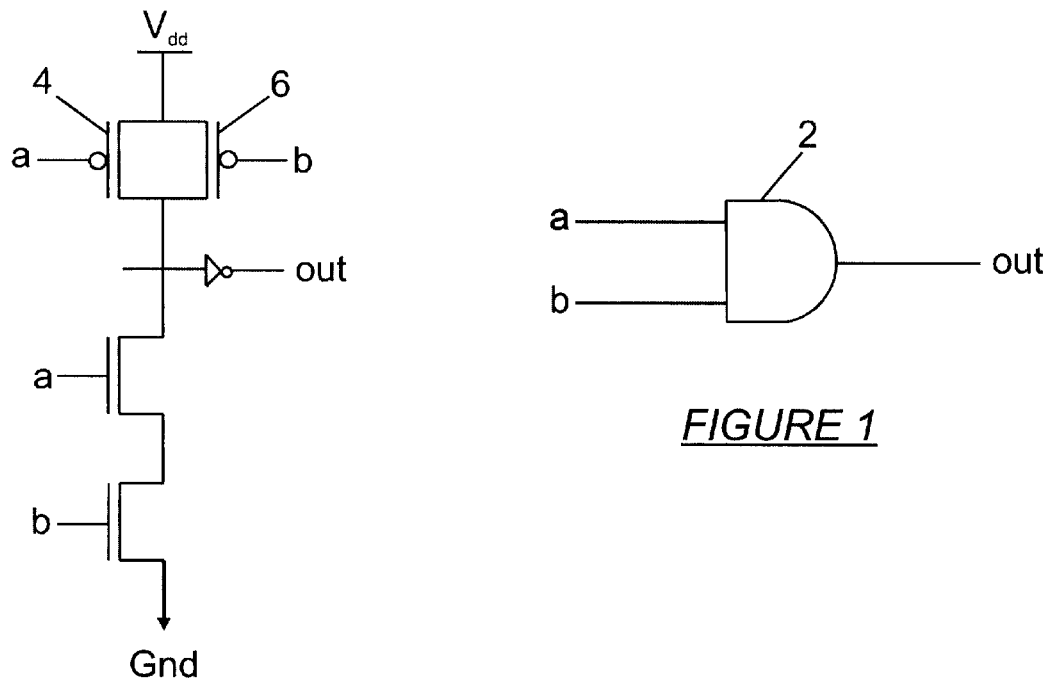
FIGURE 1
FIGURE 2
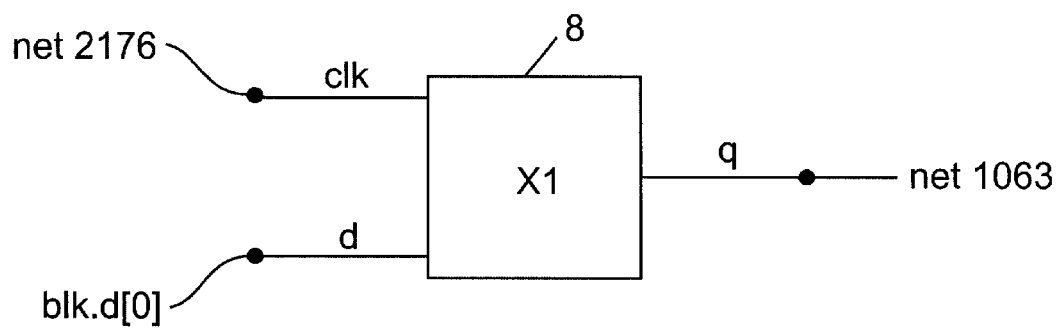
FIGURE 3A

LATCH MAPPER

BACKGROUND OF THE INVENTION

1. Field of the Invention

The invention relates generally to design of digital systems, e.g., a computer or a component of a computer. More specifically, the invention relates to a method and apparatus for constructing a latch mapping.

2. Background Art

Modern computer and electrical engineers use hardware description languages such as Verilog HDL and VHDL to describe a digital system from a functional specification of the digital system. The engineers may describe the digital system at different levels of abstraction. One of the higher-level descriptions of the digital system is the register transfer level (RTL). In the RTL, variables and data operators are used to describe registers and transfer of vectors of information between registers. For example, in the RTL, a very simple digital circuit performing an AND operation may be described as "OUT=a&b," where "&" represents the AND operation between the variables a and b and OUT represents the output of the digital circuit. The next lower-level description of the digital system is the gate level. At the gate level, the digital system may be described as a set of interconnected logic gates, e.g., AND and OR, and memory components, e.g., flip-flops and latches. FIG. 1 shows a gate level description 2 of the RTL description: "OUT=a&b." The lowest-level description of the digital system is the transistor level. At the transistor level, the digital system may be described as a set of interconnected wires, resistors, and transistors on an integrated circuit (IC) chip. The transistor-level schematic is used to create the physical model of the IC chip. FIG. 2 shows the digital circuit of FIG. 1 at the transistor level. The digital circuit includes two transistors 4, 6 which are coupled to perform an AND operation on input signals a and b.

In practice, a digital system would consist of hundreds of thousands to millions of transistors. Thus, formal verification is important in designing functionally correct digital systems. Formal verification is checking to see whether the system performs its intended function. One form of formal verification called equivalence checking involves proving equivalence between two designs, which may be at the same level or different levels of abstraction. Equivalence checking is often used to prove equivalence between the RTL model and the transistor-level schematic of the digital system. Equivalence checking in sequential circuits, i.e., digital circuits containing latches and flip-flops, typically consists of two steps. The first step involves constructing a latch mapping, also known as a register mapping. The latch mapping identifies corresponding latches in the two designs to be compared. Once the corresponding latches are identified, it is then possible to decompose the designs into corresponding combinational blocks. The second step is to verify whether the corresponding combinational blocks are equivalent. If the combinational blocks are equivalent, then the two designs are functionally equivalent.

There are various techniques for checking equivalence of combinational blocks. See, for example, Jerry R. Burch and Vigyan Singhal, "Robust Latch Mapping for Combinational Equivalence Checking," Proceedings of the 1998 IEEE/ACM international conference on Computer-aided design, 1998, pages 563–569, Pranav Ashar et al., "Using Complete-1-Distinguishability for FSM Equivalence Checking," Proceedings of the 1996 IEEE/ACM International Conference on Computer-aided design, 1996, pages 346–353, and Andreas Kuehlmann and Florian Krohm, "Equivalence Checking Using Cuts and Heaps," Proceedings of the 34th annual conference on Design automation conference, 1997, pages 263–268.

Various methods are known for constructing latch mapping between two designs. In general, these methods can be divided into three categories: structure mapping, function mapping, and name-matching mapping. Structure mapping involves matching structurally similar latches. For example, the latches 8, 10 shown in FIGS. 3A and 3B are structurally similar because they have their ports "d" connected to the same data block "b1k.d[0]," their ports "q" connected to the same net "1063," and their ports "clk" connected to the same net "2176." Thus, the latches 8, 10 will be correlated in the latch mapping. Function mapping involves analyzing and using the functional properties of the latches to correlate the designs. In function mapping, for example, two latches may be correlated because they have one set of ports connected to a net whose function is "a&b&c" and another set of ports connected to a net whose function is "clk." Name-matching mapping depends on the latches in the two design models having similar labels. For example, the labels "X1" and "SX1" of the latches 12, 14 shown in FIGS. 4A and 4B are similar because they both contain "X1." Thus, the latches 12, 14 will be correlated in the latch mapping. Typically, there will be mapping rules that indicate which portions of the labels are relevant to latch mapping.

In the practical implementation of formal equivalence, label correspondence can become a weak link. This is because the circuit designer often uses different labels than the logic designer. Also, tools that perform design transformation, such as synthesis or clock tree insertion, often do not preserve labels, especially when the design is being flattened as part of the transformation. Thus, there is a possibility that some latches will be unmapped because they cannot be correlated to other latches. Thus, if two combinational blocks are found to not be equivalent, it may be because of an incorrect label matching rather than a bug in the circuit. This, of course, complicates the debugging process. However, in an environment with a naming convention, it is worthwhile to have a tool that can perform name matching mapping because the function/structure mapping techniques use complex algorithms that can sometimes fail. Also, function/structure mapping techniques are more suited to an environment where equivalence checking is being performed between two designs at the same level (e.g., gate-gate).

SUMMARY OF THE INVENTION

In one aspect, the invention is a method for constructing a latch mapping between a first level description and a second level description of a digital system, wherein the first level description and the second level descriptions identify components in the digital system using a predefined naming convention. The method comprises identifying first latch components in the first level description and, for each identified latch component, storing a first string comprising a selected property of the first latch component in a first storage. The method further includes identifying second latch components in the second level description and, for each identified second latch component, storing a second string comprising a selected property of the second latch component in a second storage. The method further includes generating a latch mapping by matching the first strings in the first storage with the second strings in the second storage.

Other aspects and advantages of the invention will be apparent from the following description and the appended claims.

BRIEF DESCRIPTION OF THE DRAWINGS

FIG. 1 is a gate-level description of a logic circuit.

FIG. 2 is a transistor-level description of the logic circuit shown in FIG. 1.

FIGS. 3A and 3B depict structurally similar latches.

DETAILED DESCRIPTION OF THE INVENTION

Embodiments of the invention provide a method and an apparatus for constructing a latch mapping from two abstract descriptions of a digital system. The invention is suitable for use in a custom design environment wherein the two descriptions of the digital system are drawn independently by different designers. However, the invention is not limited to custom design environments. The invention is also suitable for use in synthesized environments wherein one description is derived from the other via synthesis or other design transformation. The invention receives the two descriptions of the digital system as input and produces a deterministic correspondence and/or an approximate correspondence between the two representations. The deterministic correspondence is a file of latch name mappings based on exact matches. The approximate correspondence is a file of approximate latch name mappings using approximate string pattern matching technique. The invention operates under the assumption that the latches in the two descriptions are instantiated as separate cells and a naming convention exists for the latches. The invention is described below with reference to two specific descriptions of the digital system, i.e., a RTL model and a transistor-level schematic. However, it should be clear that the invention is not limited to these specific descriptions of the digital system.

Figure 3B:
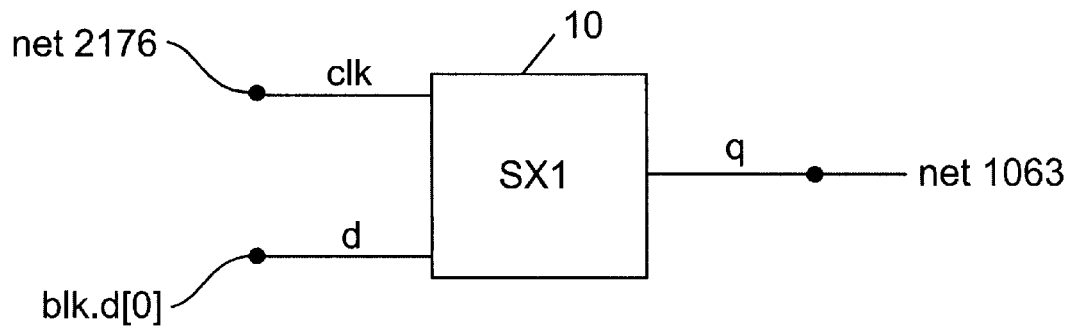
Figure 4A:
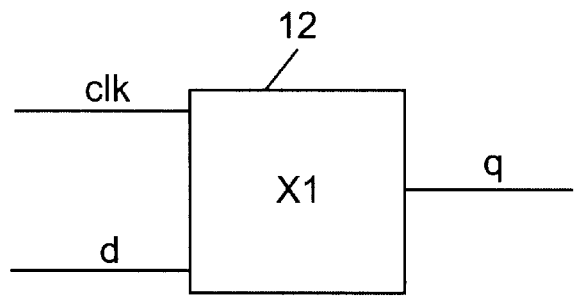
FIGS. 4A and 4B depict latches having similar labels.
Figure 4B:
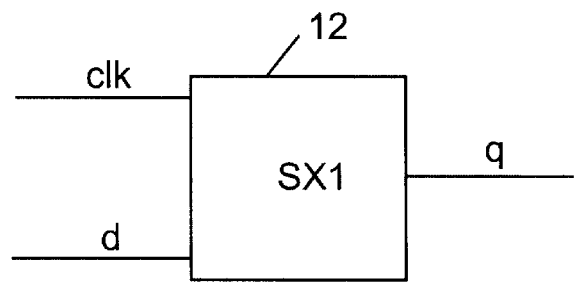
Figure 5A:
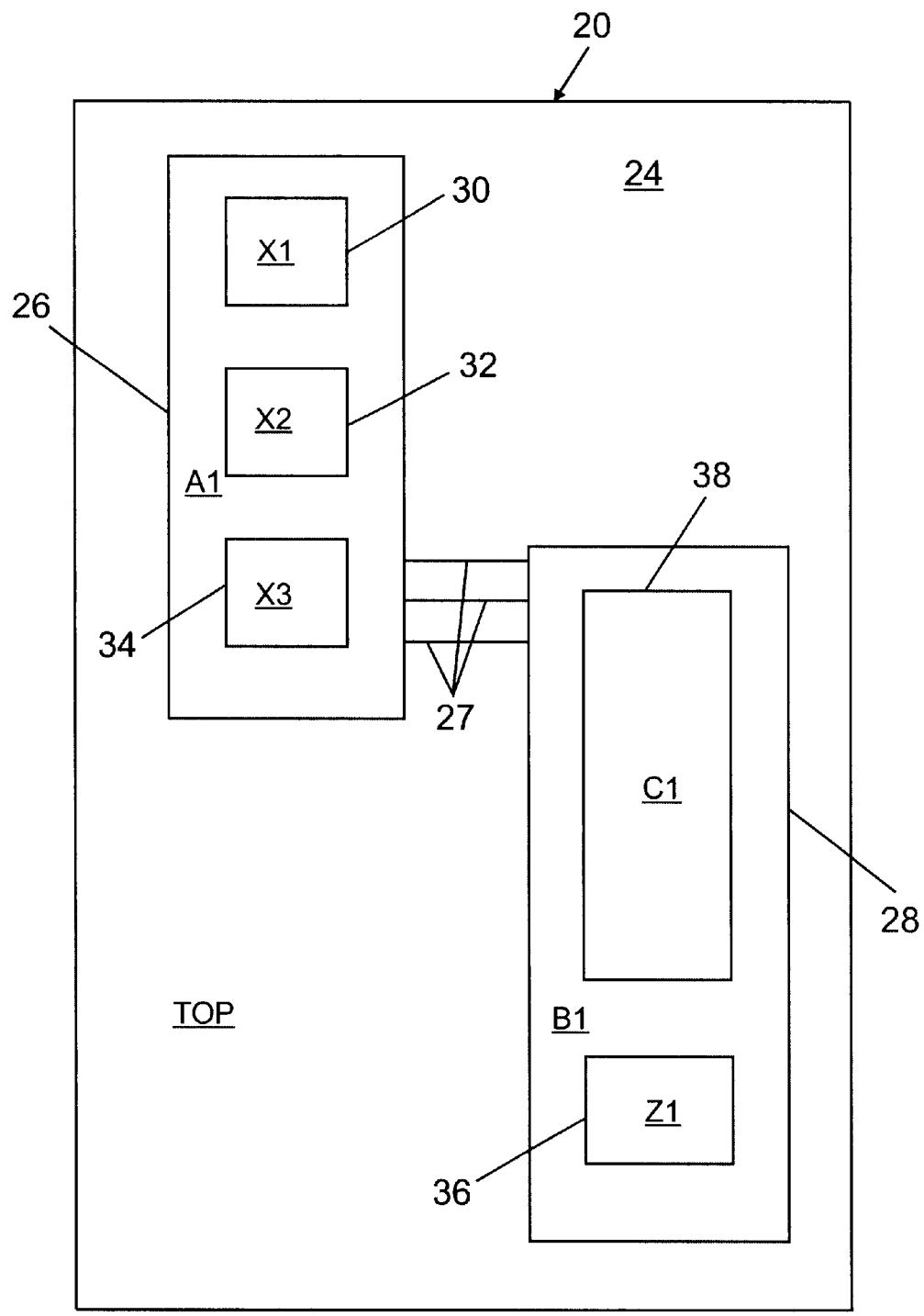
FIG. 5A is a block diagram of a RTL description of a digital system.
Figure 5B:
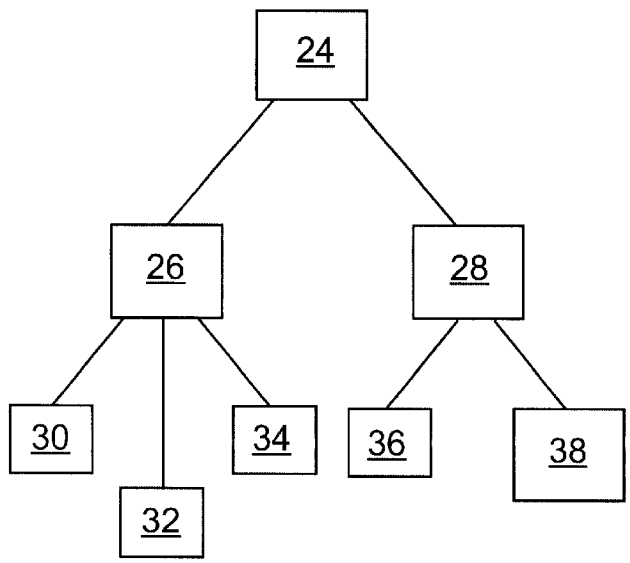
FIG. 5B is a tree view of the block representation shown in FIG. 5A.
Figure 6B:
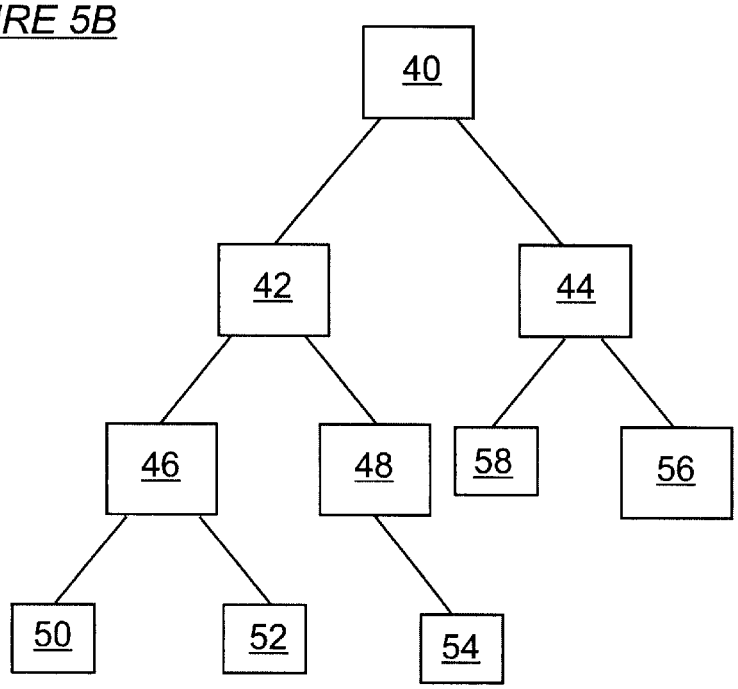
FIG. 6B is a tree view of the block representation shown in FIG. 6A.
Figure 6A:
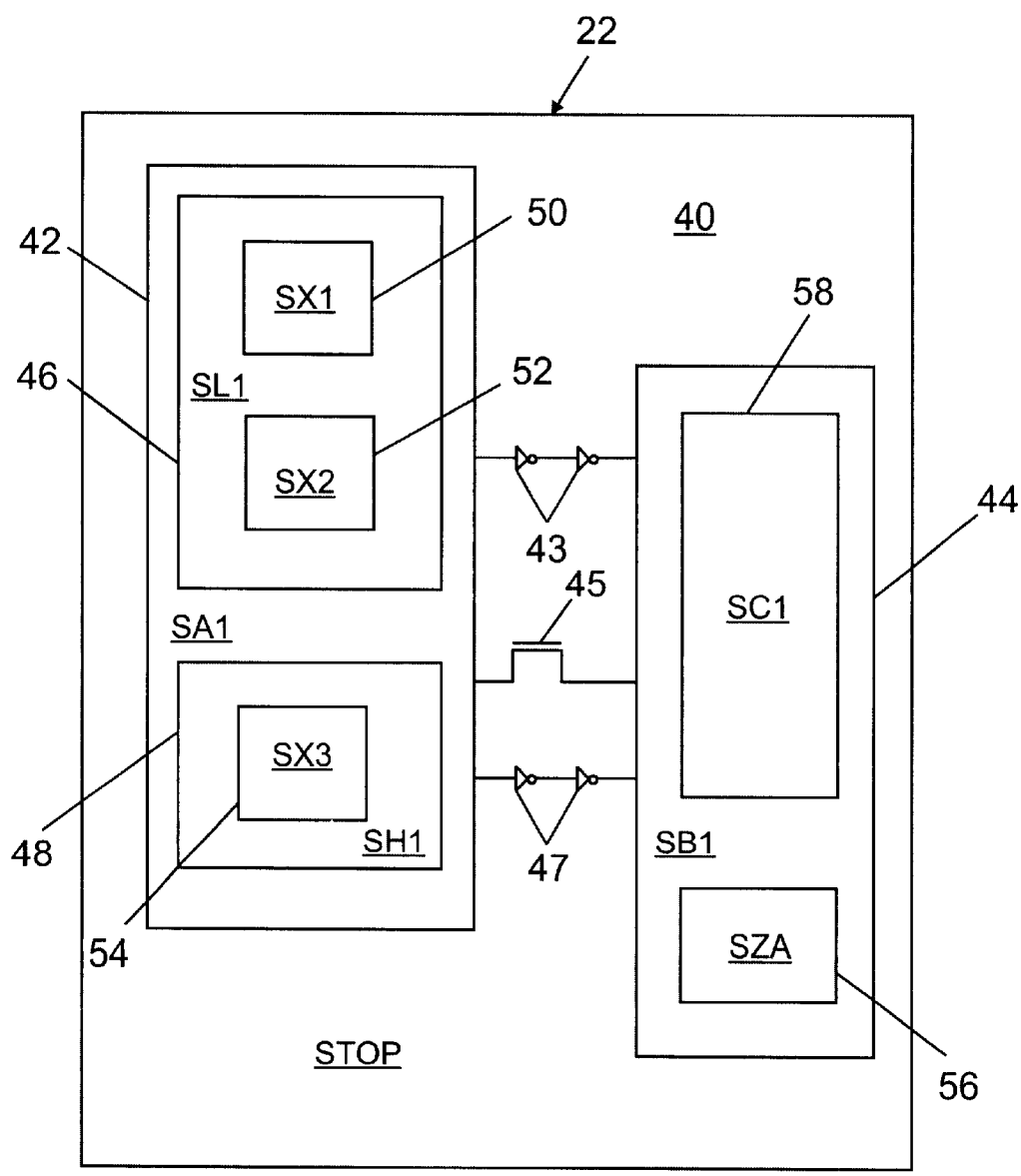
FIG. 6A is a block diagram of a transistor-level schematic of a digital system.

Various embodiments of the invention will now be described with respect to the accompanying figures. FIGS. 5A and 6A show block representations of a RTL description 20 (FIG. 5A) and a transistor-level schematic 22 (FIG. 6A) whose latches are to be mapped prior to equivalence checking. It should be noted that the RTL description 20 and the transistor-level schematic 22 shown in FIGS. 5A and 6A, respectively, are intended for illustrative purposes only and do not perform any particular function. FIGS. 5B and 6B show hierarchical or tree views of the block representations shown in FIGS. 5A and 6A, respectively. In high-level HDLs such as Verilog HDL and VHDL, the RTL description and the transistor-level schematic are represented as a set of modules, each of which has an interface that describes how it is connected to other modules. Modules can represent pieces of hardware ranging from simple logic gates to complete systems, e.g., a microprocessor. The modules can be expressed behaviorally or structurally. A behavioral specification defines the behavior of the module using traditional programming constructs. A structural specification expresses the behavior of the module as a hierarchical interconnection of sub modules. The components at the bottom of the hierarchy must be primitives, e.g., gates and switches, or expressed behaviorally.

In Verilog-RTL, a module has the following structure:

```
module <module name>(<port list>);
<declares>
<module items>
endmodule
``` where <module name> is an identifier that uniquely names the module, <port list> is a list of input, input, and output ports which are used to connect to other modules, <declares> section specifies data objects as registers, memories, and wires as well as procedural constructs such as functions and tasks, and <module items> may be initial constructs, always constructs, continuous assignments or instances of modules. All these terms are well known in the art. See, for example, "CSCI 320 Computer Architecture Handbook on Verilog HDL" by Daniel C. Hyde, Computer Science Department, Bucknell University, Lewisburg, Pa. The RTL description is typically printed to a file as a set of modules in a predefined format such as the structure described above. The transistor-level schematic is typically printed to a file in the form of a netlist, where a netlist is essentially a listing of all the elements of a logic circuit and their connectivity.

Referring to FIGS. 5A and 6A, the RTL description 20 includes a top-level module 24 which contains instances of other predefined modules. For example, the modules 26–38 are all instances of some predefined modules. The top-level module 24 itself is an instance of a predefined module. Each instance module has a unique "instantiation" name. In the computing world, instantiate means create. The instantiation name of the top-level module 24, for example, is "TOP." The instantiation names of the modules 26, 28, which depend from the top-level module 24, are "A1" and "B1," respectively. The modules 26 and 28 are linked, as shown by lines 27. The instantiation names of the modules 30, 32, 34, which depend from module 26, are "X1," "X2", "X3," respectively. The instantiation names of modules 36, 38, which depend from module 28, are "Z1" and "C1," respectively. The modules 30–36 are instances of a module called "DFF." In Verilog, the module DFF has the following general structure:

```
module DFF (q, d, clk);
always@clk
q=d
end module
``` where q is the output port, d is the input port, and clk is the input port. The module DFF is of type LATCH, so the instance modules 30–36 are latches. The instantiation names of the modules 26–38 are assigned in accordance with some predefined naming convention. For example, the instantiation names of the modules 26–38 have the general structure "@#," where @ is a string of characters belonging to some known alphabet and # is an integer. The modules 26–38 can be referenced from the top-level module 24. For example, the reference names for the modules (latches) 30–36 are "TOP.A1.X1," "TOP.A1.X2," "TOP.A1.X3," "TOP.B1.Z1," respectively.

Referring to FIGS. 6A and 6B, the transistor-level schematic 22 includes a top-level module 40 which invokes instances of other predefined modules. For example, the modules 42–58 are all instances of some predefined modules. The top-level module 40 itself is an instance of a predefined module. Each instance module has a unique instantiation name. For example, the instantiation name of the top-level module 40 is "STOP." The instantiation names of the modules 42 and 44, which depend from the top-level module 40, are "SA1" and "SB1," respectively. The modules 42, 44 are linked together, as indicated by circuit elements 43, 45, 47. The instantiation names of the modules 46 and 48, which depend from module 42, are "SL1" and "SH1," respectively. The instantiation names of modules 50 and 52, which depend from module 46, are "SX1" and "SX2," respectively. The instantiation names of the module 54, which depends from the module 48, is "SX3." The instantiation names of the modules 56 and 58, which depend from module 44, are "SZA" and "SC1," respectively.

The modules 50–56 are instances of a module called "LAT1." The module LAT1 is of type LATCH, so the instance modules 50–56 are latches. The instantiation names of the modules 42–58 are assigned in accordance with some predefined naming convention. For example, the names of the modules 42–58 have the general structure "S@#," where @ is a string of characters belonging to some known alphabet and # is an integer. It should be noted that this naming convention is similar to the one used in the RTL description 20 (shown in FIG. 5A), except that the instantiation names are preceded by the character "S." The structure of the instantiation name for the module (latch) 56 has been slightly altered from the general structure "S@#," probably by some design transformation operation. The modules 42–58 may be referenced from the top-level module 40 in the manner previously described for the RTL description 20. For example, the reference name for the module (latch) 50 is "STOP.SL1.SX1."

As can be observed, there are more instance modules in the transistor-level schematic 22 than there are in the RTL description 20 (shown in FIGS. 5A and 5B). Furthermore, the design hierarchies in the RTL description 20 (shown in FIGS. 5A and 5B) and the transistor-level schematic 22 (shown in FIGS. 6A and 6B) are not the same. The problem is then to construct a latch mapping between the RTL description 20 and the transistor-level schematic 22. For very simple logic circuits, the latch mapping can be constructed by visual inspection of the design hierarchies. But for large digital systems, latch mapping by visual inspection or other form of manual name matching is virtually impossible. To this end, the invention provides a method and an apparatus for automating the process of constructing a latch mapping between two representations of a digital system.

Figure 7:
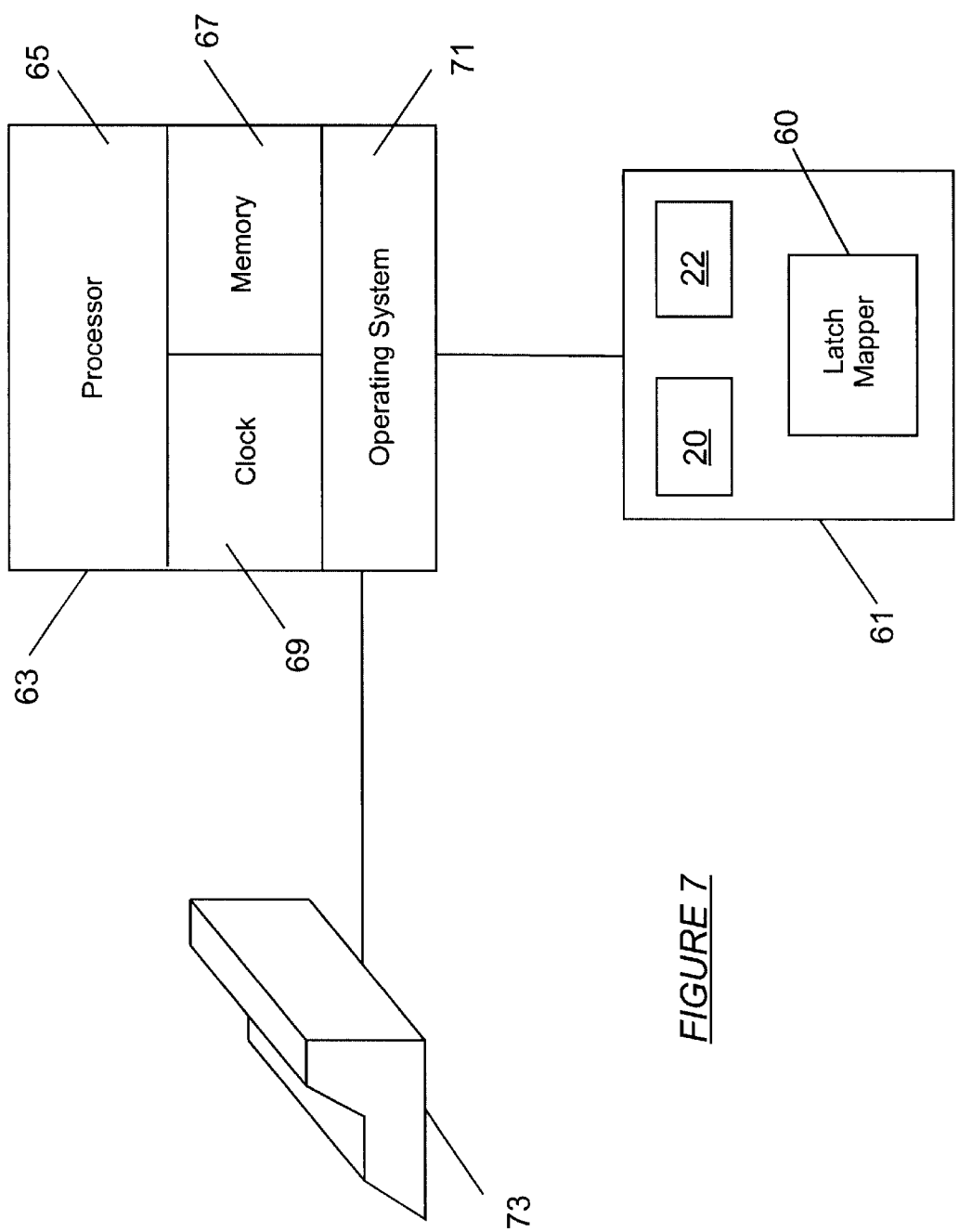
FIG. 7 illustrates a computer system which includes a latch mapper.

Referring to FIG. 7, a latch mapper 60 is stored in a direct-access storage device 61. The RTL description 20 and the transistor-level schematic 22 may also be stored in the storage device 61 or some other storage device. The storage device 61 communicates with a computer 63 in a manner well known in the art. The computer 63 includes a processor 65, a memory 67, a clock 69, and an operating system 71. The computer 63 is connected to receive user input via terminal 73. The operating system 71 performs various tasks, including recognizing input from the terminal 73 and sending output to the terminal 73 and keeping track of the files and directories on the magnetic disk 61. The processor 65 loads instructions which are to be executed into the memory 67, and the clock 69 regulates the rate at which instructions are executed. In one embodiment, the latch mapper 60 is implemented as a set of instructions which can be executed by the processor 65 in response to user input via terminal 73 or in response to a call from an application. Upon execution, the latch mapper 60 receives the RTL description 20 and the transistor-level schematic 22 as input and constructs a latch mapping.

Figure 8:
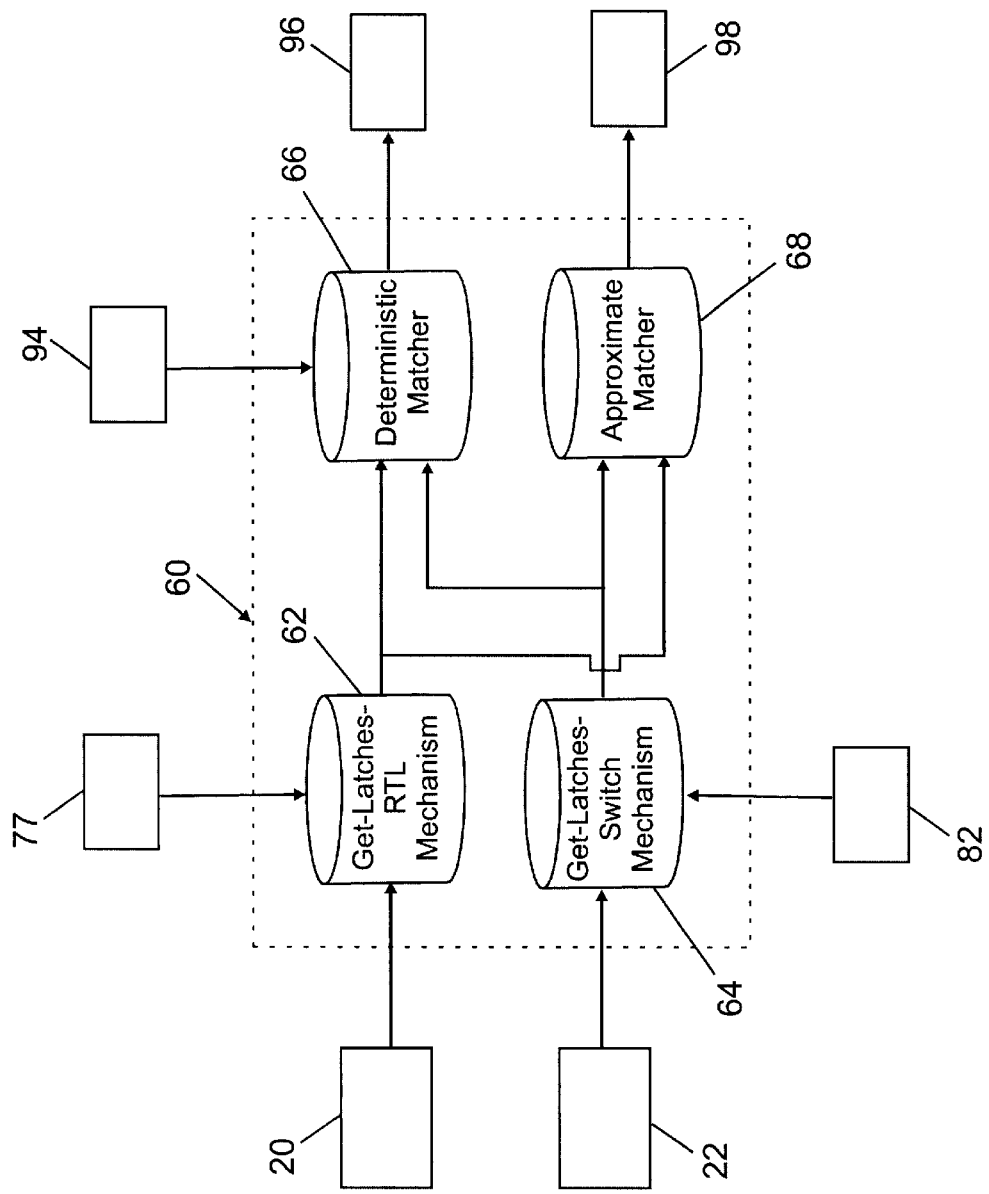
FIG. 8 is a block diagram of the latch mapper shown in FIG. 7 in accordance with one embodiment of the invention.

FIG. 8 shows a block diagram of the latch mapper 60 in accordance with one embodiment of the invention. In this embodiment, the latch mapper 60 includes four basic components: a Get-Latches-RTL mechanism 62, a Get-Latches-Switch mechanism 64, a Deterministic matcher 66, and an Approximate matcher 68. The Get-Latches-RTL mechanism 62 retrieves latches from the RTL description 20. The Get-Latches-Switch mechanism 64 retrieves latches from the transistor-level schematic 22. The latches from the RTL description 20 and the latches from the transistor-level schematic 22 are then compared by the Deterministic matcher 66 and the Approximate matcher 68. The Deterministic matcher 66 and Approximate matcher 68 use string matching techniques to correlate the latches in the two descriptions of the digital system. The Deterministic matcher 66 relies on exact string matching techniques, while the Approximate matcher 68 relies on approximate string matching techniques.

Figure 9:
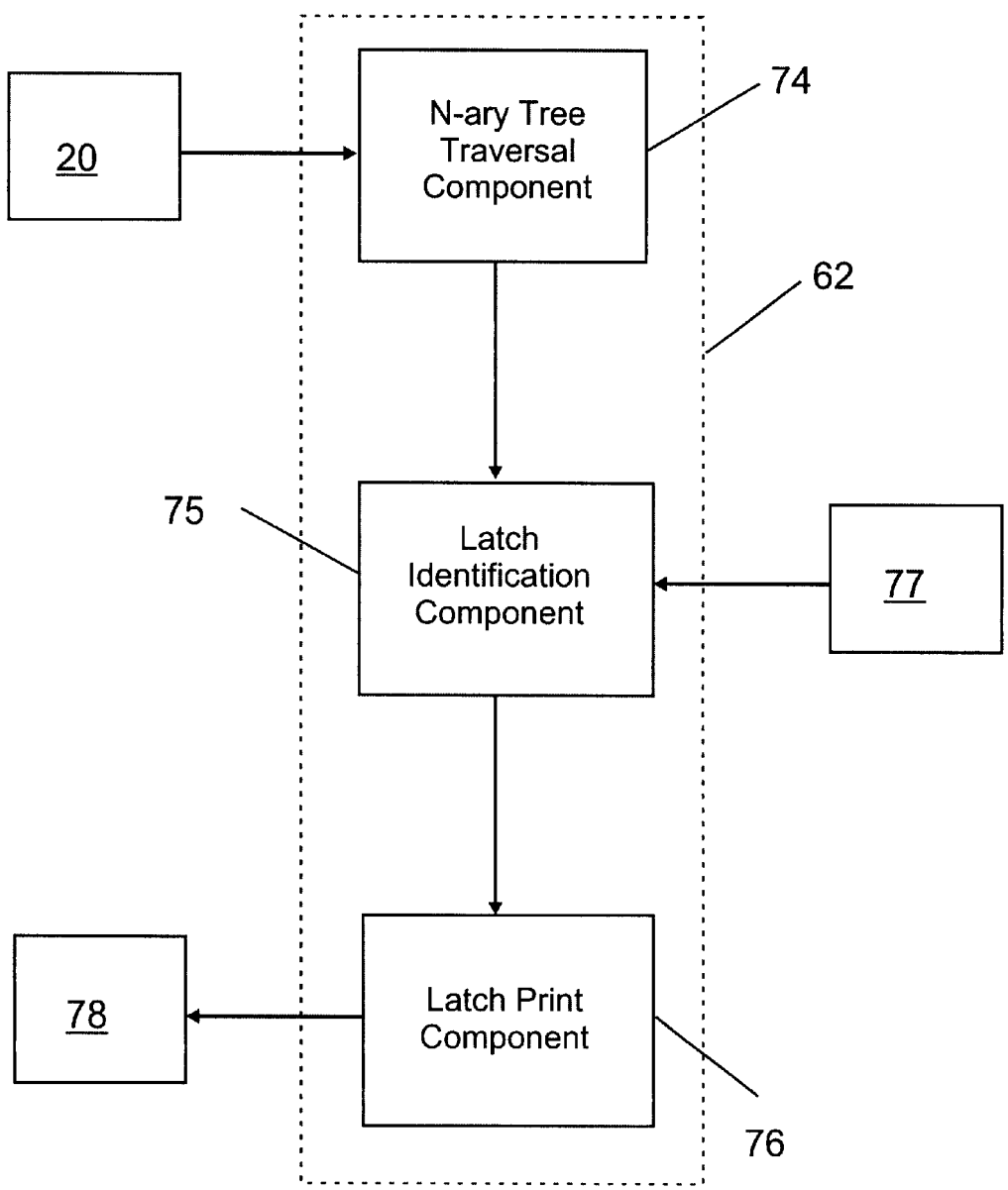
FIG. 9 is a block diagram of a mechanism for retrieving latches from a RTL model according to one embodiment of the invention.

FIG. 9 shows a block diagram of the Get-Latches-RTL mechanism 62. The Get-Latches-RTL mechanism 62 includes a N-ary Tree Traversal component 74, a Latch Identification component 75, and a Latch Print component 76. It should be noted that the "N" in the "N-ary Tree" represents the maximum number of links that a node in the tree can contain. The N-ary Tree Traversal component 74 receives the RTL description 20 as input and traverses the logic design hierarchy to obtain pointers to all the modules in the RTL description 20. The RTL description 20 may be written in any suitable HDL, e.g., Verilog. The N-ary Tree Traversal component 74 stores the pointers to the modules, i.e., the module names, in a sequential unordered list. There are several known algorithms for traversing a tree. A large number of these algorithms are discussed in data structures and algorithms textbooks. In one embodiment, the data structure for the storage is an array called RTL-Module array. Thus, for example, the RTL-Module array for the RTL description 20 shown in FIG. 5A would contain the following strings:

"TOP," "TOP.A1," "TOP.A1.X1," "TOP.A1.X2," "TOP.A1.X3," "TOP.B1," "TOP.B1.C1," "TOP.B1.Z1."

It should be noted that other suitable data structures, e.g., linked list, could be used to store the pointers to the modules.

The Latch Identification component 75 identifies the latches in the RTL-Module array using a list 77 that contains names of modules of type LATCH in the RTL description 20. The list 77 can either be hard-coded or can be supplied to the Latch Identification component 75 as a parameter. For the RTL description 20 shown in FIG. 5A, the list 77 would contain the module name "DFF." The Latch Identification component 75 examines all the ports (input, output, input) of each module in the RTL-Module array. Using the list 77, the Latch Identification identifies modules of type LATCH, i.e., modules instantiated from module DFF. For each module of type LATCH, the output port and the net (wire), or circuit element, connected to the output port are printed out. As an example, the name of the output port of the instance module (latch) 30 (shown in FIG. 5A) would be "TOP.A1.X1.q," and the name of the corresponding net could be "TOP.A1.X1.net2063," where "q" is the output port and "net2063" is just some arbitrary net name selected for illustration purposes. For this example, the output port and its corresponding net are printed as follows:

"LATCH TOP.A1.X1.net2063 PORT TOP.A1.X1.q."

Alternatively, the name of the input or input port of each module of type LATCH and the name of the net or data block connected to the port may be printed out.

For each module of type LATCH, the Latch Identification component 75 may optionally print the instantiation name of the module and latch type for the "wide latch." A wide latch is a parameterized latch, also known as register, defined within a module. Registers can be declared at the RTL, but not at the transistor-schematic level. Wide latches can be 128-bit wide, while latches at the transistor-schematic level can only be 1-bit wide. The number of wide latches correspond to the number of registers in the RTL description 20. The wide-latch printouts are used just to obtain extra information about the latches in the RTL description 20 and do not have any real bearing on the function of the Get-Latches-RTL mechanism.

The Latch Identification component 75 uses the Latch Print component 76 to print the identified latches to a file 78 using the format described above, that is:

"LATCH U PORT V,"

where U and V are delimited strings having substrings separated by a predefined delimiter such as a period (.). The delimited string U will be referred to as the latch name string, and the delimited string V will be referred to as the port name string. The delimited string V represents a selected port of the latch, e.g., the output port. The delimited string U represents the circuit element, e.g., the net, connected to the selected port of the latch. The Get-Latches-RTL mechanism 62 may be implemented as a routine in any suitable programming language. For example, the Get-Latches-RTL mechanism 62 may be implemented as a Verilog PLI routine. When the routine is compiled, the Get-Latches-RTL mechanism 62 retrieves all the latches from modules of type LATCH in the RTL description 20 and prints the latches to the file 78.

Figure 10:
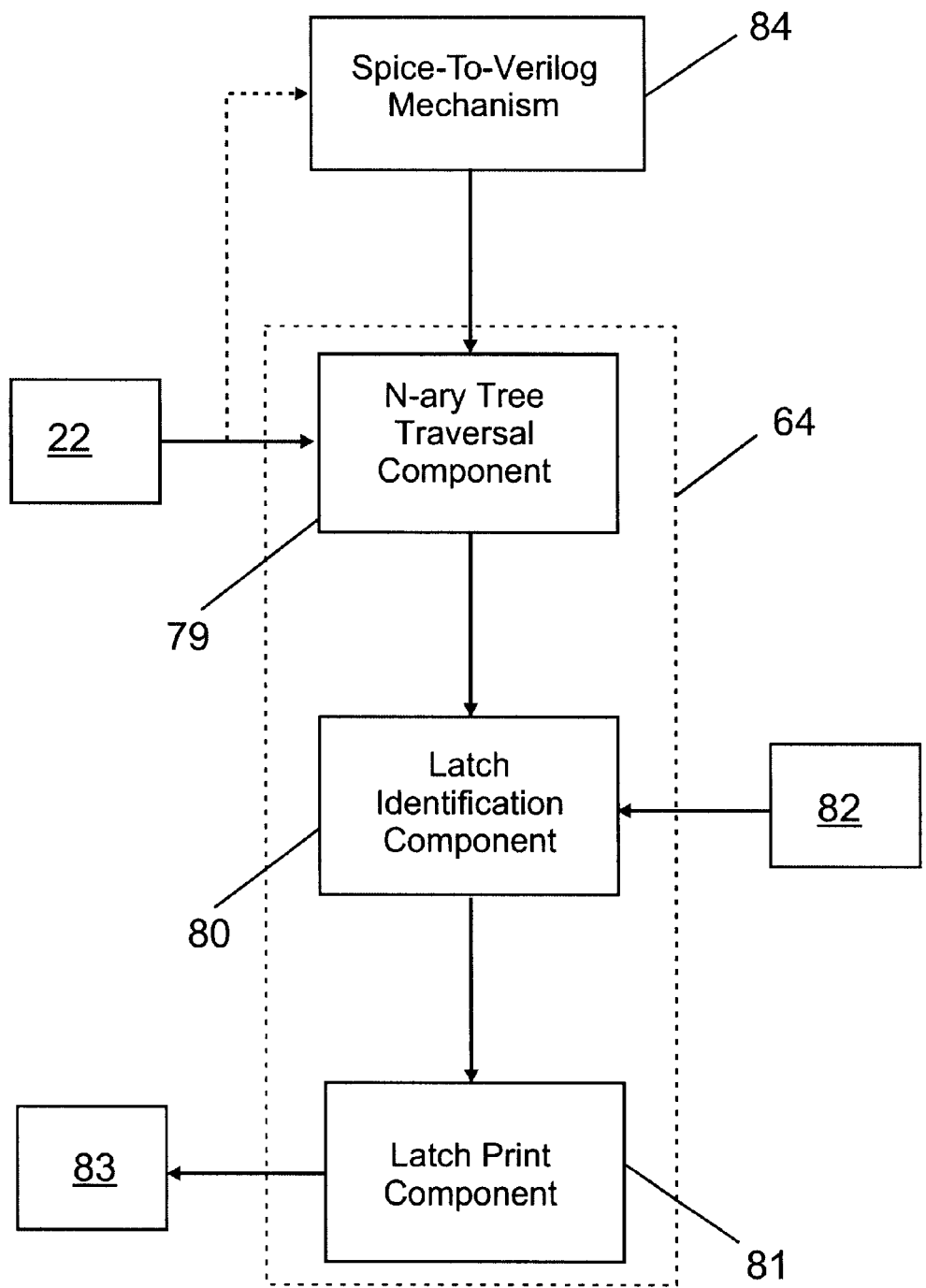
FIG. 10 is a block diagram of a mechanism for retrieving latches from a transistor-level schematic according to one embodiment of the invention.

The Get-Latches-Switch mechanism 64 (shown in FIG. 10) works similarly to the Get-Latches-RTL mechanism 62. FIG. 10 shows a block diagram of the Get-Latches-Switch mechanism 64. The Get-Latches-Switch mechanism 64 includes a N-ary Tree Traversal component 79 (similar to the N-ary Tree Traversal component 74), a Latch Identification component 80 (similar to the Latch Identification component 75), and a Latch Print component 81 (similar to the Latch Print component 76). The N-ary Tree Traversal component 79 receives the transistor-level schematic 22 as input and traverses the logic design hierarchy to obtain pointers to all the modules in the transistor-level schematic 22. The N-ary Tree Traversal component 79 stores the pointers to the modules, i.e., the module names, in a sequential unordered list. In one embodiment, the data structure for the storage is an array called Switch-Module array. Thus, for example, the Switch-Module array for the design hierarchy shown in FIGS. 6A and 6B would contain the following strings:

"STOP," "STOP.SA1," "STOP.SA1.SL1," "STOP.SA1.SL1.SX1," "STOP.SA1.SL1.SX2," "STOP.SA1.SL1.SX3," "STOP.SA1.SH1," "STOP.SA1.SH1.SX3," "STOP.SB1," "STOP.SB1.SC1," "STOP.SB1.SZA."

The Latch Identification component 80 identifies the latches in the Switch-Module array using a list 82 that contains names of modules of type LATCH in the transistor-level schematic 22. The list 82 can either be hard-coded or can be supplied to the Latch Identification component 80 as a parameter. For the transistor-level schematic 22 shown in FIG. 6A, the list 82 would contain the module name "LAT1." The Latch Identification component 80 examines all the ports (input, output, input) for each module in the Switch-Module array. If the module type is LATCH, i.e., if the module name is LAT1, then the names of the output port and the net (wire) connected to the output port are printed out. As an example, the name of the output port of the instance module (latch) 50 (shown in FIG. 5A) would be "STOP.SA1.SL1.SX1.q," and the name of the corresponding net (net name) could be "STOP.SA1.SL1.SX1.net2063." For this example, the output port and its corresponding net are printed as follows:

"LATCH STOP.SA1.SL1.SX1.net2063 PORT STOP.SL1.SA1.SX1.q."

Alternatively, the name of the input or input port of each module of type LATCH and the name of the net or data block connected to the port may be printed out.

The Latch Identification component 80 uses the Latch Print component 81 to print the identified latches to a file 83. The identified latches should be printed in a format similar to the one used in the Get-Latches-RTL mechanism 62, or a postprocessor may be needed to make the retrieved latches in the Get-Latches-RTL mechanism 62 and the Get-Latches-Switch 64 conform to the same format. The Get-Latches-Switch mechanism 64 may be implemented as a routine in any suitable programming language. For example, the Get-Latches-Switch mechanism 64 may be implemented as a Verilog PLI routine. When the routine is compiled, the Get-Latches-Switch mechanism 64 retrieves all the latches from a given module in the transistor-level schematic 22 and prints a selected property of the latches to the file 83. The selected property of the latch may be, for example, the output port of the latch and its corresponding net.

The components used in the Get-Latches-Switch mechanism 64 are similar to the components used in the Get-Latches-RTL mechanism 62. However, the transistor-level schematic 22 may provided to the Get-Latches-Switch 64 as a hierarchical netlist in a format other than the HDL used in the RTL model 30. For example, the transistor-level schematic 22 may be provided as a hierarchical Spice netlist, as is well known in the art. If the transistor-level schematic 22 is provided as a hierarchical Spice netlist, for example, and the RTL description 20 is provided as a Verilog-RTL, a conversion of the Spice netlist to a transistor-level Verilog netlist will be needed to allow the Get-Latches-Switch mechanism 64 to use the same components in the Get-Latches-RTL mechanism 62. In this case, the transistor-level schematic 22 is supplied to a Spice-To-Verilog conversion mechanism 84. The Spice-To-Verilog mechanism 84 converts the hierarchical Spice netlist to a transistor-level Verilog netlist. The output of the Spice-To-Verilog mechanism 84 then serves as the input to the Get-Latches-Switch mechanism 64.

Figure 11:
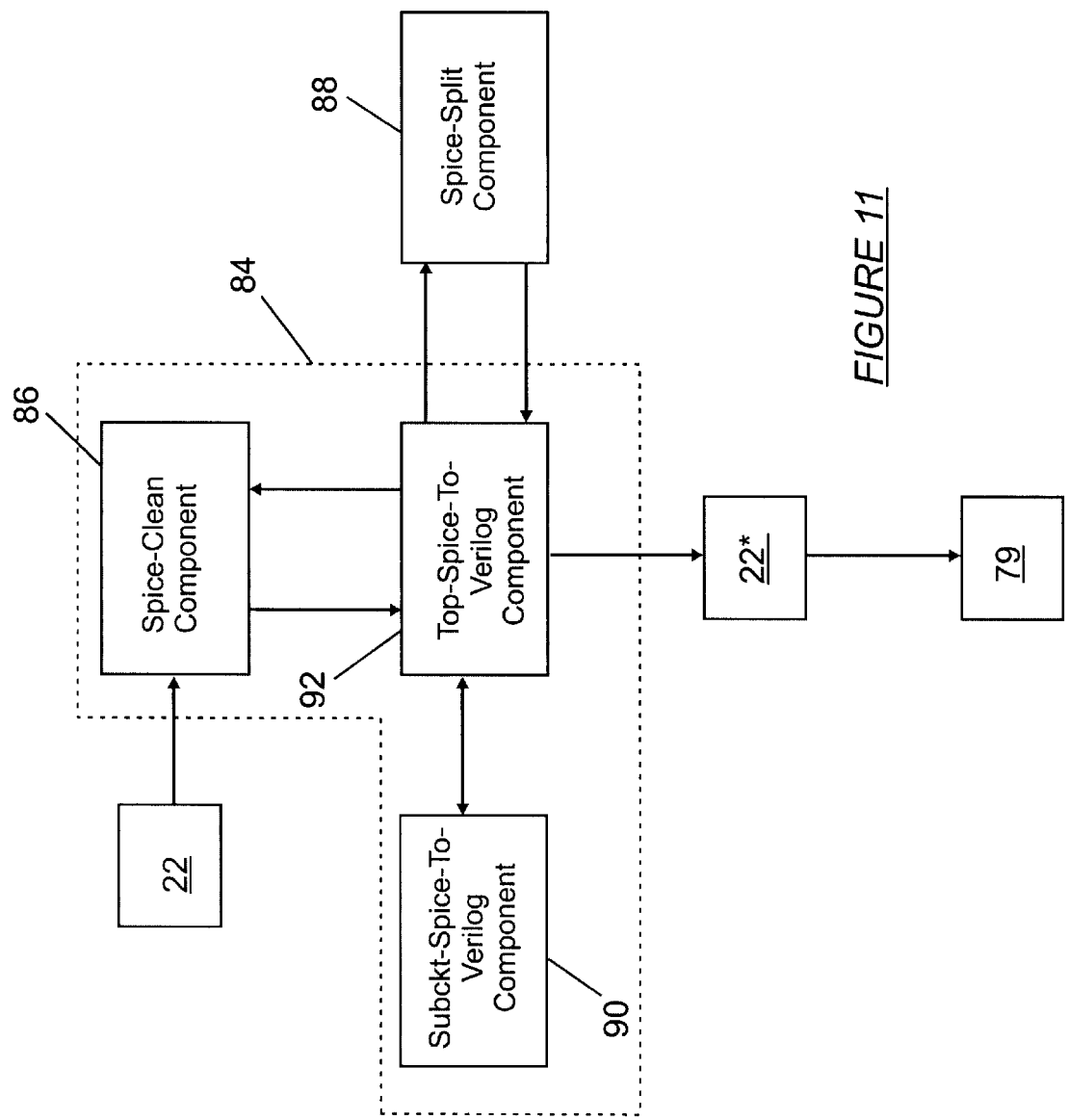
FIG. 11 is a block diagram of a mechanism for converting a Spice netlist to a Verilog netlist.

FIG. 11 shows a block diagram of the Spice-To-Verilog mechanism 84 which converts a hierarchical Spice netlist to a transistor-level Verilog netlist. The Spice-To-Verilog 84 mechanism includes Spice-Clean 86, Spice-Split 88, Subckt-Spice-To-Verilog 90, and Top-Spice-To-Verilog 92 components. The Spice-Clean component 88 preprocesses the Spice netlist and cleans up the information not needed by the latch mapper 60, e.g., resistance, capacitance, and other physical device information. The Spice-Split component 88 splits the cleaned Spice file into individual sub-circuits. It is assumed that the top-level sub-circuit is not defined. The top-level sub-circuit is then created and called "TOP.SPS". The top-level sub-circuit consists of all transistors not in any other sub-circuit. The Subckt-Spice-To-Verilog component 90 converts each Spice sub-circuit into a Verilog transistor-level model. As a result, TN and TP transistors are converted to Verilog primitives like PMOS and NMOS. Top-Spice-To-Verilog 92 controls the overall Spice-To-Verilog conversion such as repeated calls to the Subckt-Spice-To-Verilog mechanism 90 to convert each Spice sub-circuit into a Verilog transistor-level model. The output of the system is a Verilog netlist which can be supplied to the Get-Latches-Switch mechanism 64.

Figure 12:
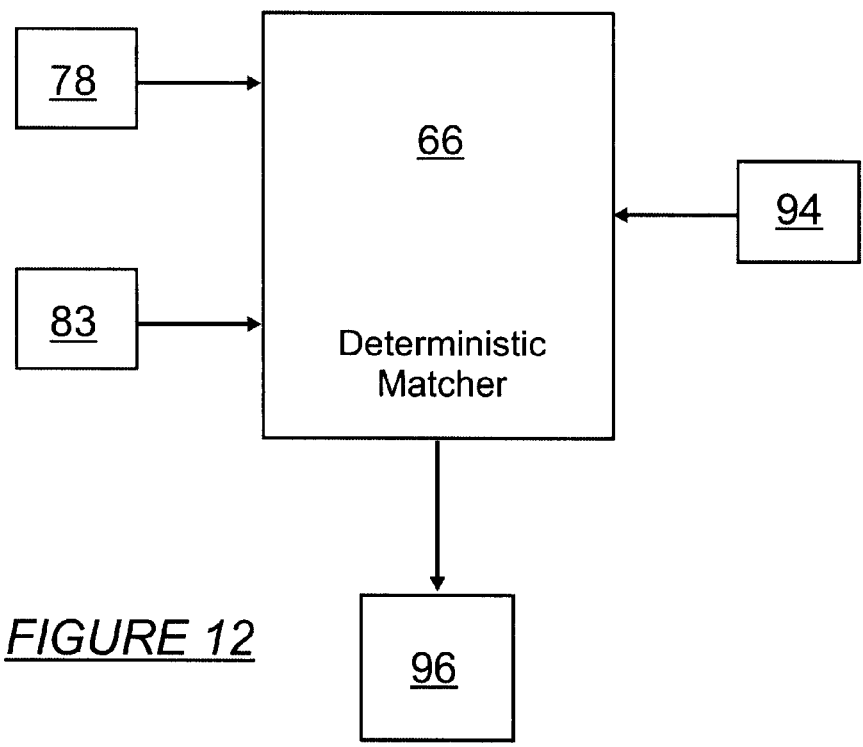
FIG. 12 illustrates the deterministic string matcher of FIG. 8 receiving the outputs of the mechanisms shown in FIGS. 9 and 10.
Figure 13:
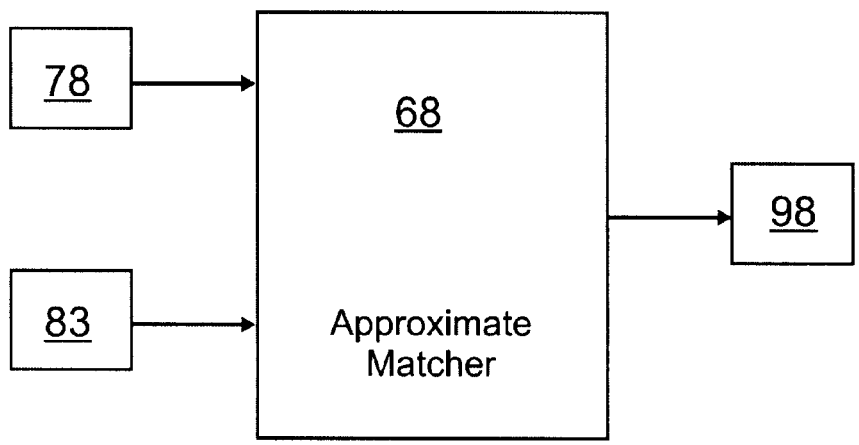
FIG. 13 illustrates the approximate string matcher of FIG. 8 receiving the outputs of the mechanisms shown in FIGS. 9 and 10.

Referring to FIG. 12, the deterministic matcher 66 receives the file 78 from the Get-Latches-RTL mechanism 62 and the file 83 from the Get-Latches-Switch 64 as inputs. The files 78 and 83 contain strings having the general structure "LATCH U PORT V," where U and V are delimited strings, U is the latch name string, and V is the port name string. The deterministic matcher 66 correlates the latches in the two files 78, 83 by matching latch name strings. The deterministic matcher 66 relies on exact matches or a mapping rule file 94 to correlate the latches in the two files 78 and 83. Exact match means that a string X matches a string Y if and only if the characters in string X exactly correspond to the characters in string Y, e.g., "ab.bc"="ab.bc". For the deterministic match technique to work, an underlying assumption could be that the "signal name" of the output port of the RTL latch is the same as the "signal name" of the output port of the corresponding transistor-level schematic latch. The signal name is the substring at the ending of the latch name string, going from right to left. All other substrings in the latch name string are called hierarchical subnames. For example, for a latch name string "A.B.d1b1," "d1b1" is the signal name and A and B are two hierarchical subnames.

In reality, the structure of the latch name strings in the file 78 will vary slightly from the structure of the latch name strings in the file 83, but in a predictable manner. The mapping file 94 includes the transformation rules for mapping a RTL latch name string to a transistor-level schematic latch name string. For example, a mapping rule may state that RTL (*.*.SIGNAME)=transistor-level schematic (*.*.X1.SIGNAME). In this case, a RTL latch name string "A.B.d1b1" will match a schematic latch name string "A.B.X1.d1b1." The mapping rule will depend on the naming conventions used in both the RTL description and the transistor-level schematic. Using the supplied mapping rules, the deterministic matcher 66 selects each of the latch name strings in the file 78 and matches it to a latch name string in the file 83. The deterministic matcher 66 matches each hierarchical subname separated by a delimiter such as a period (.). Conflicts between more than one matching names are broken by the deepest match. For example, using the mapping rule RTL (*.*.SIGNAME)=transistor-level schematic(*.*.X1.SIGNAME), a RTL latch "A.B.d1b1" matches both transistor-level schematic latches "A.C.X1.d1b1" and "A.B.X1.d1b1." However, the transistor-level schematic latch "A.B.X1.d1b1" has precedence because it has a deeper match (two-level hierarchical subname match) as opposed to "A.C.X1.d1b1" (one-level hierarchical subname match). The output of the deterministic matcher 66 is a file 96 containing correlated latches.

The approximate matcher 68 also receives the file 78 from the Get-Latches-RTL mechanism 62 and the file 83 from the Get-Latches-Switch 64 as inputs. The approximate matcher 68 uses approximate matching techniques such as disclosed in application entitled "Approximate String Matcher for Delimited Strings" by Arun Chandra, filed Jun. 14, 2000, and assigned to the assignee of the present invention. The approximate matcher 68 does not need a mapping rule file. The approximate matcher 68 also does not assume that the "signal name" of the latch name string of a RTL latch is the same as the "signal name" of the latch name string of the corresponding transistor-level schematic latch. Each latch name string extracted from the RTL file 78 is compared to each latch name string extracted from the transistor-schematic level file 83 using an approximate string matching technique such as that disclosed in "Approximate String Matcher for Delimited Strings," supra. The results of approximate string matching are not guaranteed, but the approximate matcher 68 is very useful when exact matches cannot be found in the file 83 for one or more of the latches in the file 78. The output of the approximate matcher 68 is a file 98 containing correlated latches.

In operation, the Get-Latches-RTL mechanism 62 receives the RTL description 20 and produces a file 78 containing the latches in the RTL description 20. The Get-Latches-Switch mechanism 64 receives the transistor-level schematic 22 and produces a file 83 containing the latches in the transistor-level schematic 22. The deterministic matcher 66 then receives the two files 78, 83 and performs a string matching operating to map the latches in one file to the other. The approximate matcher 68 also receives the two files 78, 83 and performs a string matching operating to map the latches in one file to the other. The outputs 96, 98 of the deterministic matcher 64 and the approximate matcher 66, respectively, may be compared to see if the deterministic matcher 64 and the approximate matcher 66 produced identical results. Where the results differ, a manual inspection of the design hierarchies may be used to ensure that the latch mapping is properly constructed. In many cases, the approximate matcher 68 will map a bigger percentage of the latches because it does not depend on exact matching techniques or mapping rules.

Although the invention has been described with respect to comparing a RTL description and a transistor-level schematic, it should be clear that the invention is not limited to these two representations. The invention is generally applicable to name-matching mapping between two independent representations of a digital system. The basic concept is to retrieve latches from the two representations by inspecting module types. The latches retrieved from the two representations are then compared using string matching techniques. The result is a set of correlated latches. Depending on the exact nature of the representations, the latch-retrieval mechanisms are designed to retrieve latches from the representations by inspecting module types.

Once the latch mapping is constructed, the equivalence of the two descriptions of the digital system, e.g., the RTL description 20 and the transistor-level schematic 22, can be checked using any suitable equivalence checking algorithm.

See, for example, Jerry R. Burch and Vigyan Singhal, "Robust Latch Mapping for Combinational Equivalence Checking," supra. Prior to checking the equivalence of the two descriptions of the digital system, the designs are broken into corresponding combinational blocks using the latch mapping. Then the equivalence checking process verifies whether the corresponding combinational blocks are equivalent. If the corresponding blocks are equivalent, then the two descriptions of the digital system are functionally equivalent.

The invention is advantageous because it produces a relatively fast mechanism for constructing a latch mapping prior to equivalence checking. Based on the assumption that a naming convention exists, the invention performs a name-matching mapping using string matching techniques. The latch mapper takes on the order of minutes to produce the latch mapping, while other mapping techniques such as structure/function mapping take hours or even days to produce a latch mapping. The invention performs a name-matching mapping on two representations of a digital system, even if the logic design hierarchies of the representations are different. The invention uses a tree-traversal mechanism to navigate design hierarchies and to identify modules in the design hierarchies.

While the invention has been described with respect to a limited number of embodiments, those skilled in the art will appreciate that other embodiments can be devised which do not depart from the scope of the invention as disclosed herein. Accordingly, the scope of the invention should be limited only by the attached claims.

What is claimed is:

1. A method for constructing a latch mapping between a first level description and a second level description of a digital system, the first level description and the second level description identifying components in the digital system using a predefined naming convention, the method comprising:

identifying first latch components in the first level description and, for each identified first latch component, storing a first string comprising a selected property of the first latch component in a first storage;

identifying second latch components in the second level description and, for each identified second latch component, storing a second string comprising a selected property of the second latch component in a second storage; and generating a latch mapping by matching the first strings in the first storage with the second strings in the second storage using the predefined naming convention.

2. The method of claim 1, wherein the storing a first string comprising a selected property of the first latch component includes retrieving from the first level description the name of a first circuit element connected to a selected port of the first latch component.

3. The method of claim 2, wherein the storing a second string comprising a selected property of the second latch component includes retrieving from the second level description the name of a second circuit element connected to a selected port of the second latch component.

4. The method of claim 3, wherein the generating a latch mapping by matching the first strings in the first storage with the second strings in the second storage includes finding an exact match of the name of the first circuit element among the names of the second circuit elements retrieved from the second level description.

5. The method of claim 4, wherein finding an exact match includes using mapping rules to correlate the names of the first and second circuit elements.

6. The method of claim 3, wherein generating a latch mapping by matching the first strings in the first storage with the second strings in the second storage includes finding an approximate match of the name of the first circuit element among the names of the second circuit elements retrieved from the second level description.

7. The method of claim 1, wherein the identifying first latch components in the first level description comprises traversing a logic design hierarchy of the first level description to obtain a list of components in the logic design hierarchy.

8. The method of claim 7, wherein each first latch component is an instance of a predefined component.

9. The method of claim 8, and wherein the identifying first latch components in the first level description further includes identifying a component in the list of components which is an instance of the predefined component.

10. The method of claim 1, wherein the identifying second latch components in the second level description comprises traversing a logic design hierarchy of the second level description to obtain a list of components in the logic design hierarchy.

11. The method of claim 10, wherein each second latch component is an instance of a predefined component.

12. The method of claim 11, wherein the identifying second latch components in the second level description further includes identifying a component in the list of components which is an instance of the predefined component.

13. A computer-readable medium having recorded thereon a program for execution by a processor, the program comprising instructions for:

identifying first latch components in a first level description of a digital system and, for each identified first latch component, storing a first string comprising a selected property of the first latch component in a first storage;

identifying second latch components in a second level description of the digital system and, for each identified second latch component, storing a second string comprising a selected property of the second latch component in a second storage; and generating a latch mapping by matching the first strings in the first storage with the second strings in the second storage using a predefined naming convention.

14. The computer readable medium of claim 13, wherein the storing a first string comprising a selected property of the first latch component includes retrieving from the first level description the name of a first circuit element connected to a selected port of the first latch component.

15. The computer readable medium of claim 14, wherein the storing a second string comprising a selected property of the second latch component includes retrieving from the second level description the name of a second circuit element connected to a selected port of the second latch component.

16. The computer readable medium of claim 15, wherein the generating a latch mapping by matching the first strings in the first storage with the second strings in the second storage includes finding an exact match of the name of the first circuit element among the names of the second circuit elements retrieved from the second level description.

17. The computer readable medium of claim 16, wherein finding an exact match includes using mapping rules to correlate the names of the first and second circuit elements.

18. The computer readable medium of claim 15, wherein generating a latch mapping by matching the first strings in the first storage with the second strings in the second storage includes finding an approximate match of the name of the first circuit element among the names of the second circuit elements retrieved from the second level description.

19. The computer readable medium of claim 13, wherein the identifying first latch components in the first level description comprises traversing a logic design hierarchy of the first level description to obtain a list of components in the logic design hierarchy.

20. The computer readable medium of claim 19, wherein each first latch component is an instance of a predefined component.

21. The computer readable medium of claim 20, wherein the identifying first latch components in the first level description further includes identifying a component in the list of components which is an instance of the predefined component.

22. The computer readable medium of claim 13, wherein the identifying second latch components in the second level description comprises traversing a logic design hierarchy of the second level description to obtain a list of components in the logic design hierarchy.

23. The computer readable medium of claim 22, wherein each second latch component is an instance of a predefined component.

24. The computer readable medium of claim 23, wherein the identifying second latch components in the second level description further includes identifying a component in the list of components which is an instance of the predefined component.

25. A method for verifying the design of a digital system described in two levels of abstraction, comprising:

identifying first latch components in a first level description of the digital system and, for each identified first latch component, storing a first string comprising a selected property of the first latch component in a first storage;

identifying second latch components in a second level description of the digital system and, for each second latch component, storing a second string comprising a selected property of the second latch component in a second storage;

generating a latch mapping by matching the first strings in the first storage with the second strings in the second storage using a predefined naming convention; decomposing the first level description and the second level description into combinational blocks using the latch mapping; and checking equivalence between the combinational blocks.

* * * * *

UNITED STATES PATENT AND TRADEMARK OFFICE
CERTIFICATE OF CORRECTION

PATENT NO. : 6,496,955 B1  
DATED : December 17, 2002  
INVENTOR(S) : Arun Chandra et al.

It is certified that error appears in the above-identified patent and that said Letters Patent is hereby corrected as shown below:

<u>Title page,</u>
Item [75], please correct the spelling of inventor's name from "Daniel L. Liebholz" to -- Daniel L. Leibholz --.

<u>Column 4,</u>
Line 29, replace the second occurrence of "input" with -- inout --

<u>Column 5,</u>
Line 1, replace "input" with -- inout --

<u>Column 7,</u>
Lines 2 and 18, replace the second occurrence of "input" with -- inout --

<u>Column 8,</u>
Line 18, replace the second occurrence of "input" with -- inout --.

Signed and Sealed this

Sixth Day of May, 2003

JAMES E. ROGAN  
*Director of the United States Patent and Trademark Office*